United States Patent
Watanabe et al.

(10) Patent No.: US 7,276,891 B2
(45) Date of Patent: Oct. 2, 2007

(54) SEMICONDUCTOR INTEGRATED CIRCUIT DEVICE AND A CONTACTLESS ELECTRONIC DEVICE

(75) Inventors: Kazuki Watanabe, Hino (JP); Ryo Nemoto, Kokubunji (JP); Yoshiaki Yazawa, Nishitokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/257,024

(22) Filed: Oct. 25, 2005

(65) Prior Publication Data
US 2006/0103449 A1    May 18, 2006

(30) Foreign Application Priority Data
Oct. 27, 2004    (JP) .............................. 2004-311723

(51) Int. Cl.
G05F 3/08    (2006.01)
G05F 3/16    (2006.01)

(52) U.S. Cl. ..................................... 323/316
(58) Field of Classification Search ............... 323/311, 323/313, 314–316; 327/538–541
See application file for complete search history.

(56) References Cited

U.S. PATENT DOCUMENTS

| 6,052,020 | A  | * | 4/2000 | Doyle | .......................... 327/539 |
| 6,323,630 | B1 |   | 11/2001 | Banba | |
| 6,531,857 | B2 | * | 3/2003 | Ju | .............................. 323/316 |
| 6,549,065 | B2 | * | 4/2003 | Opris | .......................... 327/539 |
| 7,092,674 | B2 | * | 8/2006 | Pan | .............................. 455/73 |

FOREIGN PATENT DOCUMENTS

| JP | 64-7805 | 6/1987 |
| JP | 11-045125 | 7/1997 |
| JP | 2000-307111 | 4/1999 |
| JP | 2002-323384 | 4/2001 |
| JP | 2003-258111 | 3/2002 |

* cited by examiner

*Primary Examiner*—Gary L Laxton
(74) *Attorney, Agent, or Firm*—Reed Smith LLP; Stanley P. Fisher, Esq.; Juan Carlos A. Marquez, Esq.

(57) ABSTRACT

To augment the temperature dependence of the voltage used to detect temperature in a semiconductor integrated circuit device having a temperature detection function, the operating power supply voltage of the semiconductor integrated circuit device needed to be enhanced. It becomes possible for such a semiconductor integrated circuit device to generate a voltage of great temperature dependence, even under a low operating power supply voltage, by including: a temperature-to-current converter which outputs a first electric current proportional to temperature; a current generator which outputs a second electric current having extremely small temperature dependence; a current subtracter which outputs a third electric current proportional to a differential current obtained by subtracting the second electric current from the first electric current; and a current-to-voltage converter which converts the third electric current into a voltage.

8 Claims, 11 Drawing Sheets

SEMICONDUCTOR INTEGRATED CIRCUIT DEVICE AND A CONTACTLESS ELECTRONIC DEVICE

CLAIM OF PRIORITY

The present application claims priority from Japanese application JP 2004-311723, filed on Oct. 27, 2004, the content of which is hereby incorporated by reference into this application.

BACKGROUND OF THE INVENTION

1. Field of the Invention

The present invention relates to semiconductor integrated circuit devices with a function of measuring temperatures, and more particularly, to a technique suitable for the temperature-to-voltage converter mounted in a semiconductor integrated circuit device.

2. Description of Related Arts

The so-called contactless IC card with a semiconductor integrated circuit device and an antenna mounted within the card implements various functions such as exchanging information between an interrogator and the semiconductor integrated circuit device, transmitting the data retained in the contactless IC card, and holding the data that was transmitted from the interrogator.

The semiconductor integrated circuit device mounted in the contactless IC card receives high-frequency signals from the interrogator by means of the antenna mounted in the contactless IC card, rectifies and smoothens the voltages developed at both ends of the antenna, and forms the internal voltages required for the operation of internal circuit.

In recent years, there has been a growing demand for more advanced functionality of the contactless IC card. Coupled with this tendency, increases in the current consumption of the semiconductor integrated circuit device mounted within the contactless IC card are making sufficient internal voltages difficult to generate. To extend the communications distance with respect to an interrogator, the circuits mounted in the contactless IC card needs to be composed so as to operate at lower voltages.

Traditionally, the ambient temperature of a semiconductor integrated circuit device has been measured by conducting a temperature-to-voltage conversion based on the temperature characteristics of diodes or MOS transistors, and then further converting the voltage into an easily processable digital signal by means of an A/D conversion circuit or the like. These methods are disclosed in, for example, Japanese Patent Laid-open No. 2000-307111 (hereinafter, referred to as Patent Reference 1) and Japanese Patent Laid-Open No. 2003-258111 (hereinafter, referred to as Patent Reference 2).

Patent Reference 1 describes a semiconductor integrated circuit device that allows the detection and control of its ambient temperature to be conducted with a one IC chip. Also, Patent Reference 2 describes a temperature detection circuit that can, by operating only when it judges temperatures, reduce current consumption, thus reduce increases in IC chip temperature with an operating current, and conduct accurate temperature judgments.

To augment the temperature dependence of the voltage to be used to detect temperatures in the means shown in Patent References 1 and 2, however, there has been a need to connect a plurality of diodes or MOS transistors in series. This has posed the problem in that the corresponding circuit encounters difficulty with its operation under a low power supply voltage due to increases in operating power supply voltage.

SUMMARY OF THE INVENTION

An object of the present invention is to provide a temperature-to-voltage converter capable of generating an output voltage with great temperature dependence even under a low operating power supply voltage.

A typical aspect of all those of the invention disclosed in the present application is briefly outlined below. That is to say, a semiconductor integrated circuit device according to the present invention, and a contactless electronic device based on the invention realize a function that generates a voltage of great temperature dependence, by having: a temperature-to-current converter that outputs a first electric current proportional to temperature; a current generator that outputs a second electric current having extremely small temperature dependence; a current subtracter that outputs a third electric current proportional to a differential current obtained by subtracting the second electric current from the first electric current; and a current-to-voltage converter that converts the third electric current into a voltage.

An advantageous effect obtained from the typical aspect of the invention disclosed in the present application is briefly outlined below. That is to say, the semiconductor integrated circuit device and contactless electronic device according to the present invention can generate a voltage of great temperature dependence even under a low operating power supply voltage.

DETAILED DESCRIPTION OF THE PREFERRED EMBODIMENTS

A semiconductor integrated circuit device and a contactless electronic device according to the present invention will be described below with reference to the accompanying drawings.

First Embodiment

Figure 1:
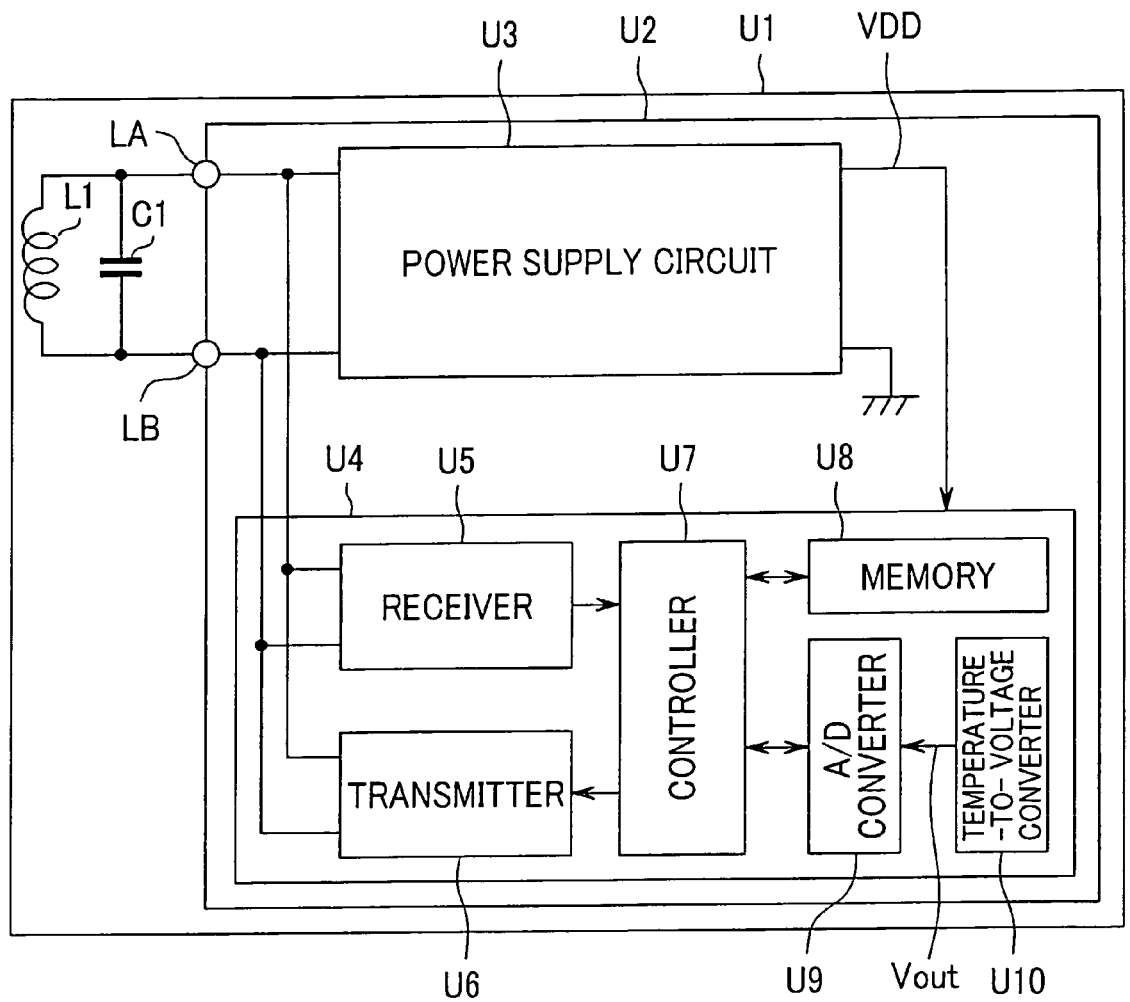
FIG. 1 is a basic block diagram showing a first embodiment of a semiconductor integrated circuit device and a contactless electronic device according to the present invention.

FIG. 1 is a basic block diagram showing a first embodiment of a semiconductor integrated circuit device and a contactless electronic device according to the present invention.

In FIG. 1, symbol U1 is a contactless electronic device, U2 is a semiconductor integrated circuit device that is mounted in the contactless electronic device U1, and L1 is an antenna that is mounted in the contactless electronic device U1. A capacitor C1 connected in parallel to the antenna L1 constitutes a resonator. The semiconductor integrated circuit device U2 includes a power supply circuit U3, an internal circuit U4, and antenna terminals LA and LB for connecting the antenna L1.

Figure 2:
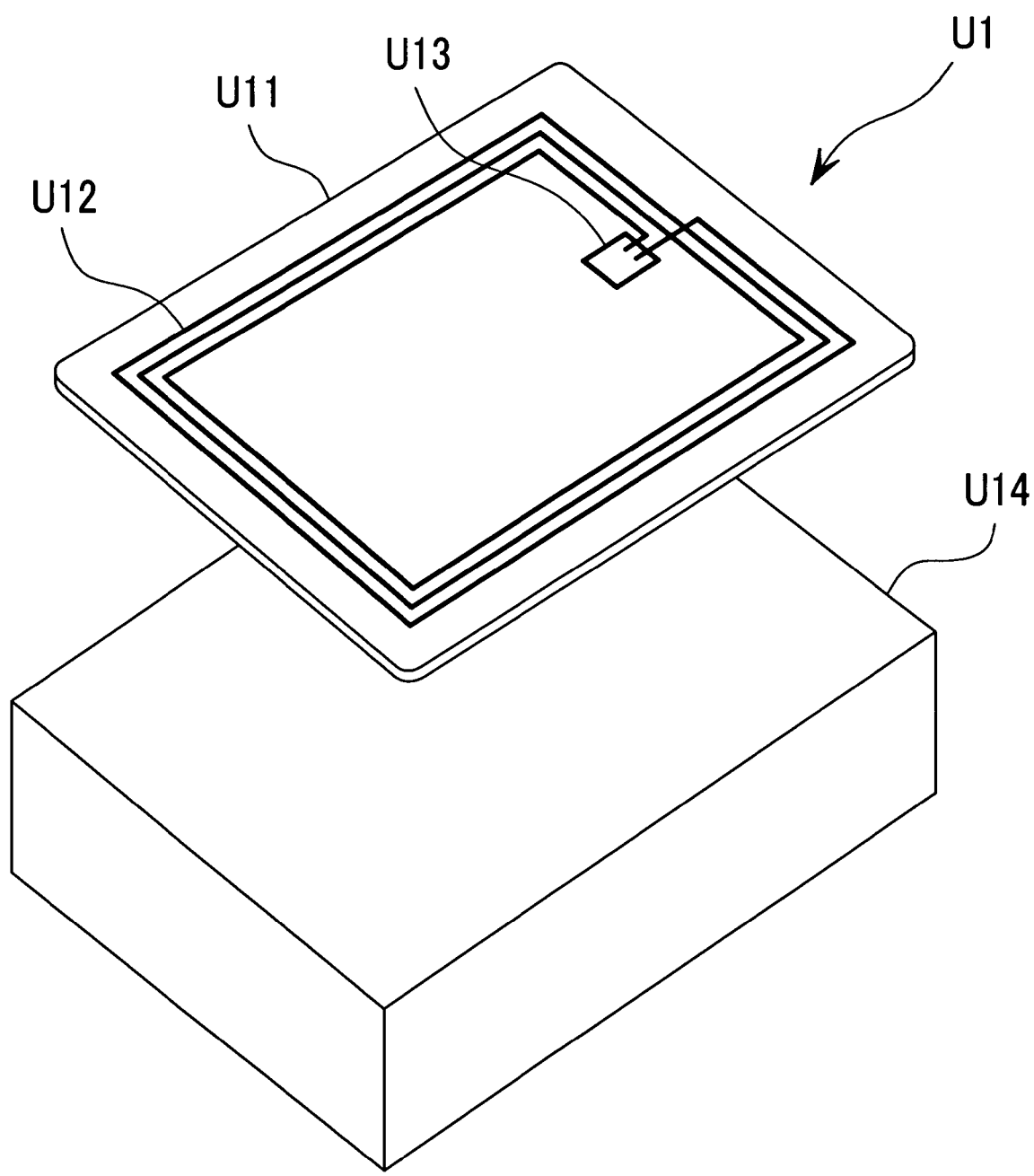
FIG. 2 is a perspective view of a wiring board of a contactless electronic device having an antenna and the semiconductor integrated circuit device according to the present invention, and an interrogator.

A structural diagram of the contactless electronic device U1 is shown in FIG. 2.

The contactless electronic device U1 uses a resin-molded printed-wiring board U11 to form a card. The antenna L1 that receives electromagnetic waves from an external interrogator U14 is constituted by a helical coil U12 formed by wiring provided on the printed-wiring board U11. The semiconductor integrated circuit device U2 constituted by one IC chip U13 is mounted on the printed-wiring board U11, and the coil U12 that is to operate as the antenna is connected to the IC chip U13.

After receiving electromagnetic waves from the interrogator U14, the antenna L1 outputs a high-frequency alternating-current (AC) signal to the antenna terminals LA and LB. The AC signal is partially modulated by means of information signals (data) beforehand.

The present invention is applied typically to the so-called contactless IC card, a contactless electronic device not having external-connection input/output terminals on the surface of the card. Of course, the present invention may also be used for a dual-type IC card having a contactless interface and input/output terminals. In addition, although not specifically limited, the semiconductor integrated circuit device U2 is formed on one semiconductor substrate such as a monocrystal silicon substrate, by use of a publicly known manufacturing technique for semiconductor integrated circuit devices.

Figure 3:
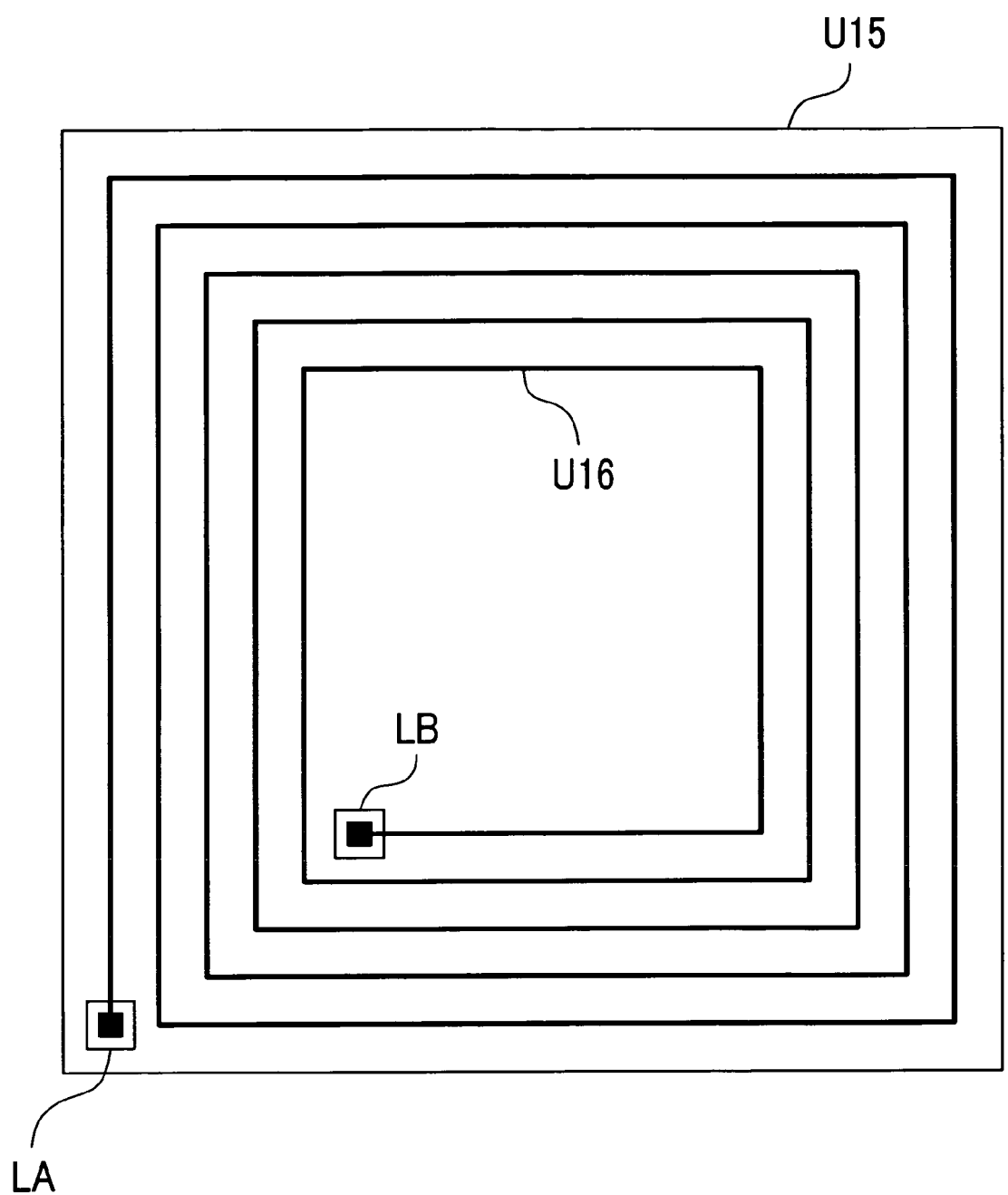
FIG. 3 is a top view of the semiconductor integrated circuit device having an antenna coil formed by an on-chip wiring layer.

A structure with an antenna coil formed on the semiconductor integrated circuit device shown in FIG. 1 is shown in FIG. 3. The antenna L1 that receives electromagnetic waves from an external interrogator is constituted by a helical coil U16 formed by a wiring layer on a semiconductor integrated circuit device U15, and is connected to antenna terminals LA and LB on the semiconductor integrated circuit device U15. As shown, the kind of contactless electronic device is not limited to the contactless IC card taking the form of a card.

Back in FIG. 1, the power supply circuit U3 is composed essentially of a rectifier and a smoothing capacitor. Of course, the power supply circuit U3 may have a regulator circuit that conducts control so that the voltage VDD output from the power supply circuit U3 will stay within a predetermined voltage level.

The voltage VDD that the power supply circuit U3 outputs is supplied as power supply voltage VDD of the internal circuit U4. The internal circuit U4 includes a receiver U5, a transmitter U6, a controller U7, a memory U8, an A/D converter U9, and a temperature-to-voltage converter U10. The receiver U5 demodulates an information signal that has been superimposed on the AC signal received by the antenna L1 within the contactless electronic device, and supplies the superimposed information signal to the controller U7 as a digital information signal. Upon receiving the digital information signal output from the controller U7, the transmitter U6 uses the received information signal to modulate the AC signal that was received by the antenna L1. After a reflection pattern of the electromagnetic waves from the antenna L1 has been changed by the above modulation, the interrogator U14 detects the change and then receives the information signal sent from the controller U7. The memory U8 is used for purposes such as recording the information/data and outgoing data signals that have been demodulated during signal exchange with the controller U7. The temperature-to-voltage converter U10 converts temperature into a voltage and outputs the voltage to the A/D converter U9 as voltage signal Vout. Upon receiving the Vout voltage output from the temperature-to-voltage converter U10, the A/D converter U9 converts the voltage into a digital signal and supplies this signal to the controller U7.

Figure 4:
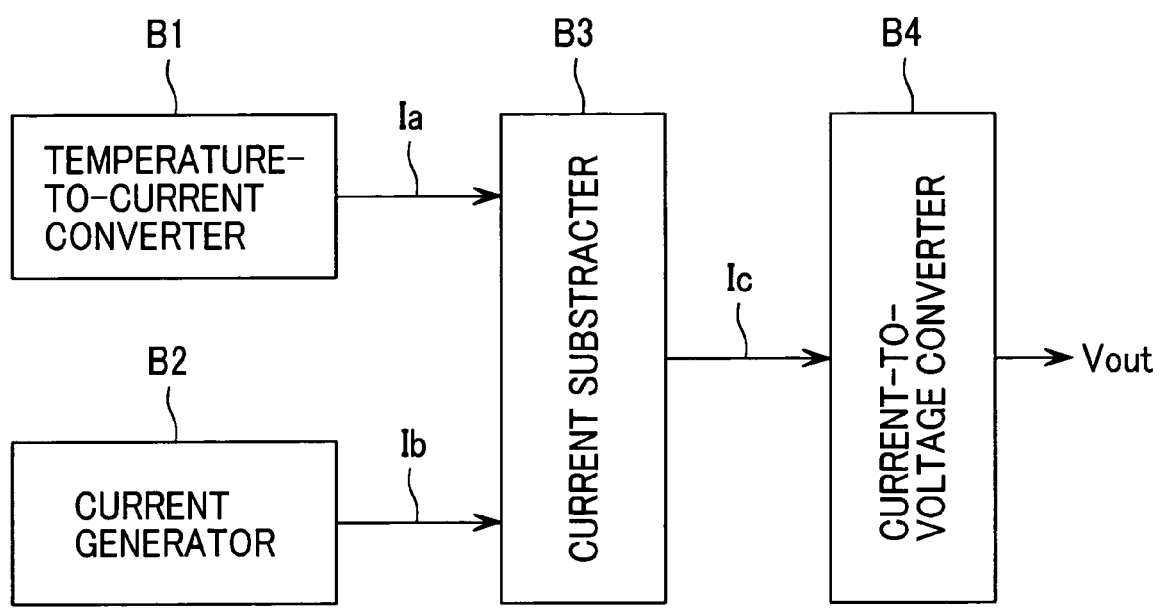
FIG. 4 is a basic block diagram of a temperature-to-voltage converter which is mounted in the semiconductor integrated circuit device of the first embodiment.

FIG. 4 is a basic block diagram of the temperature-to-voltage converter U10 mounted in the semiconductor integrated circuit device of the present embodiment.

The temperature-to-voltage converter U10 in FIG. 4 includes: a temperature-to-current converter B1 which outputs an electric current Ia proportional to temperature; a current generator B2 which outputs a constant electric current Ib extremely small in temperature dependence; a current subtracter B3 that outputs an electric current Ic proportional to a differential current obtained by subtracting the output current Ib from the output current Ia; and a current-to-voltage converter B4 that converts the electric current Ic into a voltage. In this construction, output voltage Vout proportional to temperature is obtained from the current-to-voltage converter B4.

Figure 5:
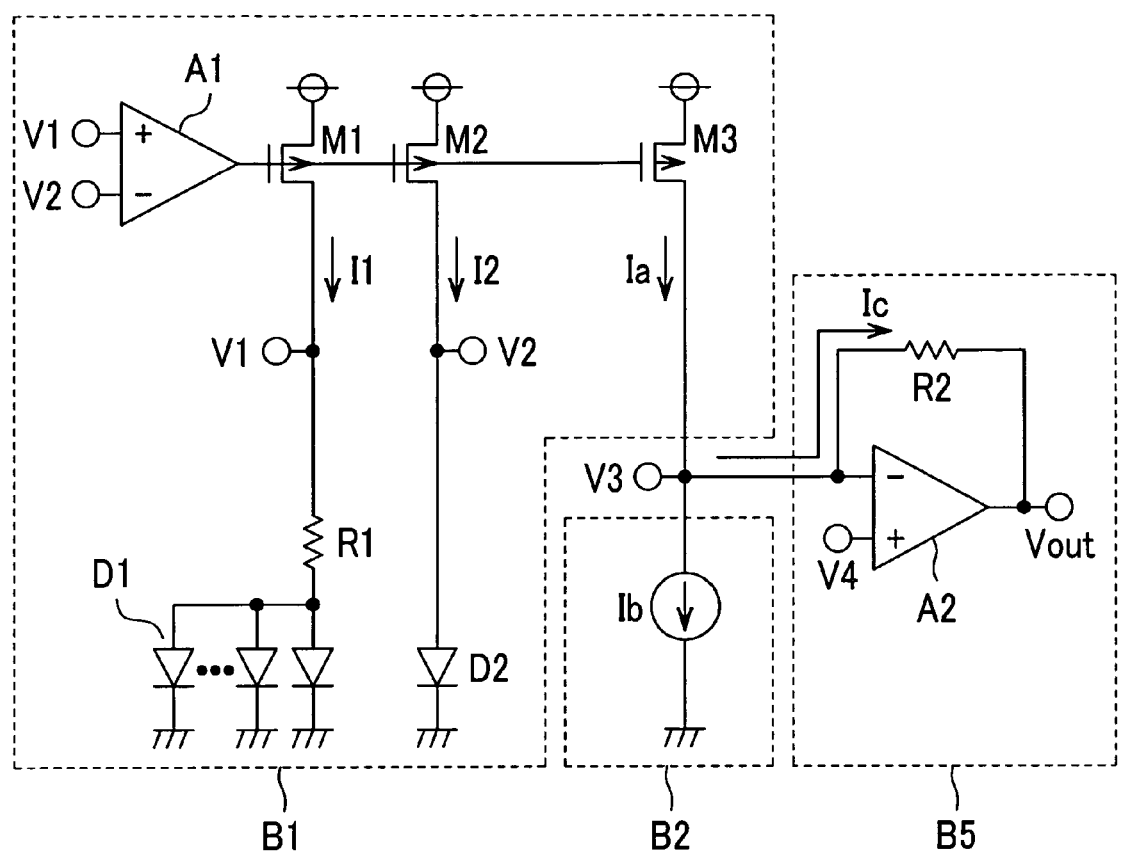
FIG. 5 is a basic circuit block diagram of the temperature-to-voltage converter mounted in the semiconductor integrated circuit device of the first embodiment.

A basic circuit block diagram of the temperature-to-voltage converter U10 mounted in the semiconductor integrated circuit device of the present embodiment is shown in FIG. 5.

The temperature-to-voltage converter in FIG. 5 includes a temperature-to-current converter B6, a current generator B2, and a current-to-voltage converter B5 with a current subtraction function.

In the temperature-to-current converter B1: an MOS transistor M1, a resistor R1, and an N number of parallel-interconnected PN-junction diodes D1 are connected in series between a first power supply voltage terminal and first grounding terminals; an MOS transistor M2 and a PN-junction diode D2 are connected in series between a second power supply voltage terminal and a second grounding terminal; and an output terminal of an operational amplifier A1 with a non-inversion input terminal (+) connected to a drain terminal of the MOS transistor M1 and with an inversion input terminal (−) connected to a drain terminal of the MOS transistor M2, is connected to respective gate terminals of the MOS transistors M1 and M2.

In this configuration of the converter B1, a voltage V1 at the drain terminal of the MOS transistor M1 and a voltage V2 at the drain terminal of the MOS transistor M2 are controlled to be equal to each other, and an output current Ia is obtained from a MOS transistor M3 whose gate terminal is connected to the output terminal of the operational amplifier A1. The current generator B2 is connected in series to the MOS transistor M3, between a third power supply voltage terminal and a third grounding terminal, and outputs a constant current Ib extremely small in temperature dependence. In the current-to-voltage converter B5, a resistor R2 is connected between an output terminal of an operational amplifier A2 which receives an input of a reference voltage V4 to a non-inversion input terminal (+) and whose inversion input terminal (−) is connected to a connection between the MOS transistor M3 and the current generator B2. In this construction of the converter B5, a voltage V3 developed at the above-mentioned connection between the MOS transistor M3 and the current generator B2 is controlled to be equal to the reference voltage V4, and an output voltage Vout is obtained from the output terminal of the operational amplifier A2.

Principles of operation of the circuits shown in FIG. 5 are described below. The description below, for its simplification, assumes that the MOS transistors M1 and M2 are equal to each other in terms of transistor size.

Expression (1) is satisfied by feedback operation of the operational amplifier A1.

$$V1=V2 \quad (1)$$

Since the MOS transistors M1 and M2 are equal in transistor size to each other as mentioned above, currents I1 and I2 that flow into the MOS transistors M1 and M2, respectively, are of an equal level. Japanese Patent Laid-open No. 11-45125 (hereinafter, referred to as Patent Reference 3) describes the operating principles of the bandgap reference voltage generator generating a reference voltage small in the temperature dependence and power supply voltage dependence of an output voltage and substantially equal to the bandgap value of silicon. Patent Reference 3 also describes a reference voltage generator that can operate, even at power supply voltages of 1.25 V or less. Citation of Patent Reference 3 allows a forward voltage VF of a diode to be represented using expression (2).

$$VF=VT \cdot ln \, (IF/Is) \quad (2)$$

where VT=kT/q (T: absolute temperature (K), q: elementary charge, k: Boltzmann's constant), wherein VT denotes a thermal voltage, Is a saturation current, and IF a current that flows into the diode. From expressions (1) and (2), a voltage ΔVF developed across the resistor R1 can be represented using expression (3).

$$\Delta VF=VT \cdot lnN \quad (3)$$

The current I1 that flows into the MOS transistors M1 and M2 is represented by expression (4) and has characteristics proportional to temperature.

$$I1=\Delta VF/R1=(1/R1)VT/lnN \quad (4)$$

In this case, since the MOS transistors M1 and M2 and the MOS transistor M3 are of an equal gate-to-source voltage, the current Ia flowing into the MOS transistor M3 will be a current proportional to the current I1 flowing into the MOS transistors M1 and M2, and the current Ia will be an output current of the temperature-to-voltage converter B1.

The differential current Ic between the output current Ia and the current Ib supplied from the current generator B2 will be induced into the resistor R2 by feedback operation of the operational amplifier A2. The output voltage Vout is thus represented as follows:

$$Vout=V4-R2 \cdot Ic \quad (5)$$

where, since the output current Ia is proportional to expression (4), it is obvious that the output current Ia is proportional to temperature.

Therefore, it is evident that the above-mentioned differential current Ic is proportional to temperature, and it can be seen that the temperature dependence of the output voltage Vout can be easily changed by adjusting a resistance value of the resistor R2.

Figure 6:
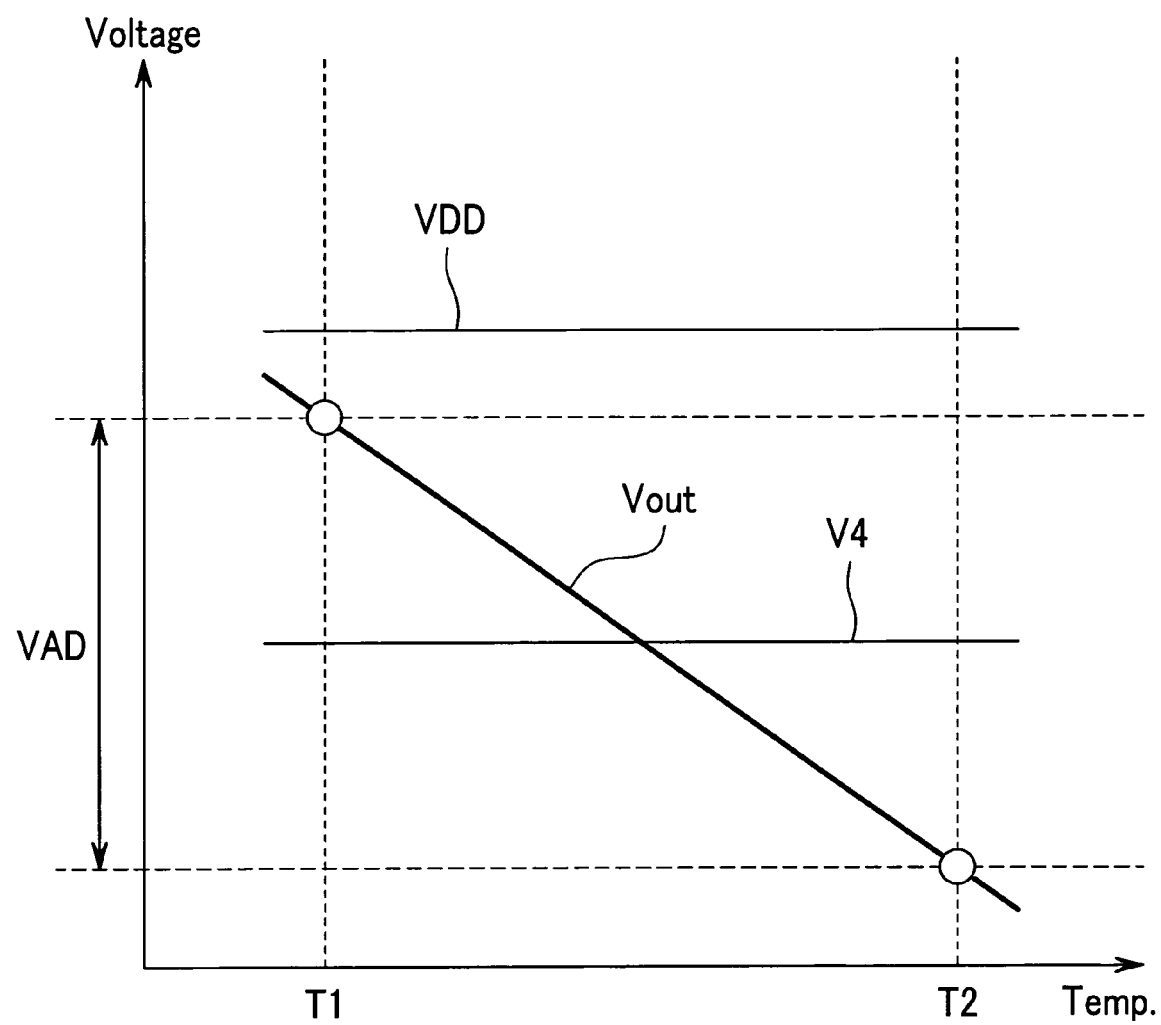
FIG. 6 is a temperature-to-voltage conversion characteristics diagram of the temperature-to-voltage converter shown in FIG. 5.

Characteristics of the output voltage signal Vout that the temperature-to-voltage converter U10 of the present embodiment generates are shown in FIG. 6. It can be seen from expression (5) that the output voltage Vout exhibits characteristics proportional to temperature, based on the reference voltage V4. For example, for a temperature-measuring range from T1 to T2, adjusting the resistance value of the resistor R2 in order for the output voltage Vout to fall within an input range of the A/D converter connected at a following stage makes it easy to utilize maximum resolution of the A/D converter. Also, lowering the reference voltage V4 allows the temperature-to-voltage converter to operate, even under a still lower power supply voltage.

Second Embodiment

Figure 7:
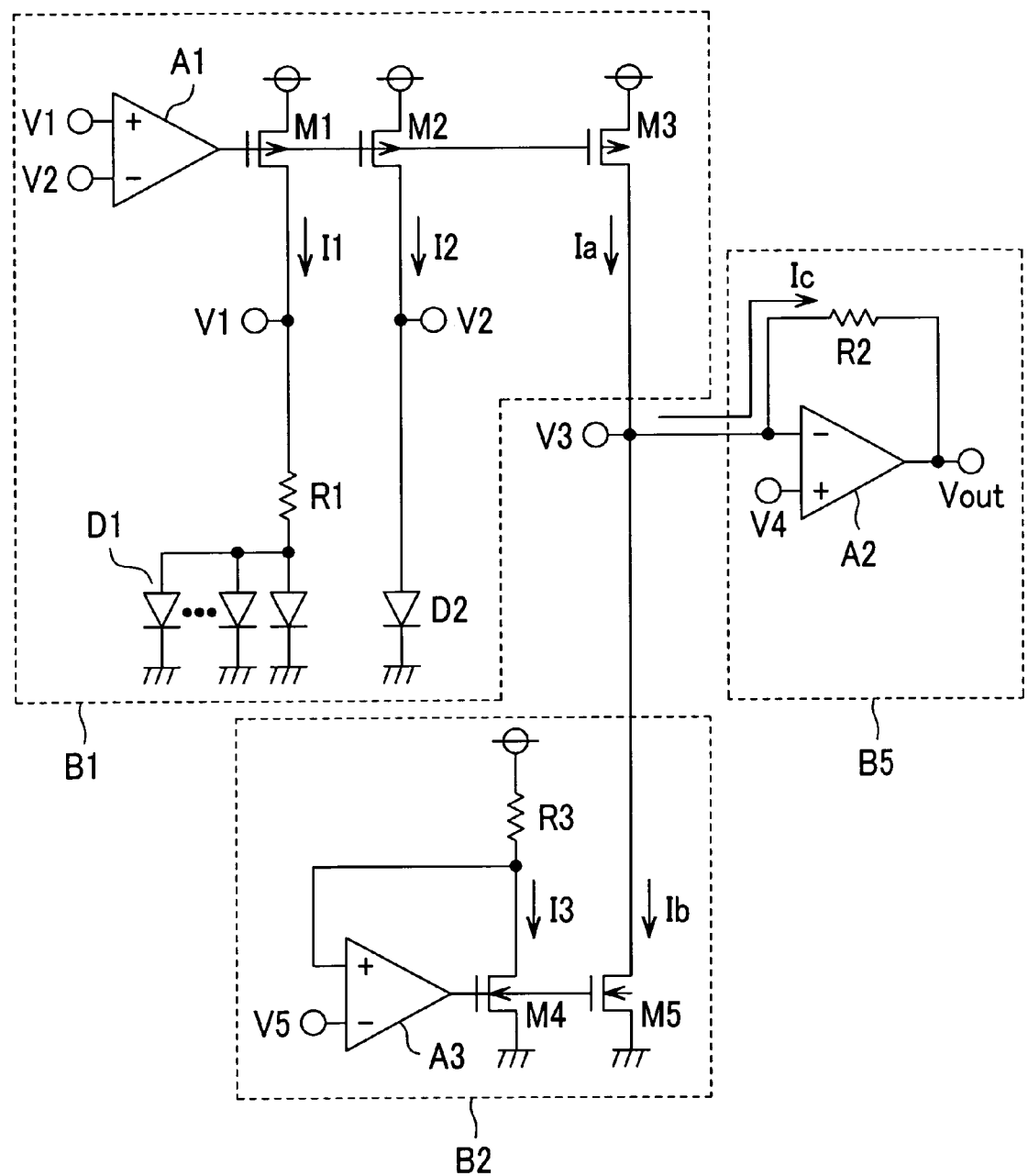
FIG. 7 is a circuit diagram showing an example of the current generator shown in FIG. 5.

FIG. 7 is a circuit block diagram showing a configuration example of a current generator B2 which constitutes the temperature-to-voltage converter of the semiconductor integrated circuit device shown in FIGS. 1 and 5 of the first embodiment.

The current generator B2 in a second embodiment is of a configuration in which a resistor R3 and a MOS transistor M4 are connected in series between a VDD power supply voltage terminal and a grounding terminal, an output voltage terminal of an operational amplifier A3 with a non-inversion input terminal (+) connected to a connection between the resistor R3 and the MOS transistor M4, and with an inversion input terminal (−) to which a reference voltage V5 is input, is connected to a gate terminal of the MOS transistor M4 and to a gate terminal of a MOS transistor M5 having a source terminal connected to an another grounding terminal. The temperature-to-current converter B1 and current-to-voltage converter B5 employed in the present embodiment are the same as those shown in FIG. 5.

Since a constant voltage (VDD−V5) is applied across the resistor R3, the current I3 that flows into the MOS transistor M4 is represented by expression (6).

$$I3=(VDD-V5)/R3 \quad (6)$$

If the resistor R3 is extremely small in temperature dependence, the current I3 that flows into the MOS transistor M4 is also extremely small in temperature dependence. Therefore, provided that power supply voltage VDD is constant and that the temperature dependence of the resistor R3 is as extremely small as temperature dependence of a current Ib which flows into the MOS transistor M5 decreases in comparison with temperature dependence of an output current Ia of the temperature-to-current converter B1, the current Ib flowing into the MOS transistor M5 can be used as an output current of the current generator B2 that outputs a constant current of extremely small temperature dependence.

Third Embodiment

Figure 8:
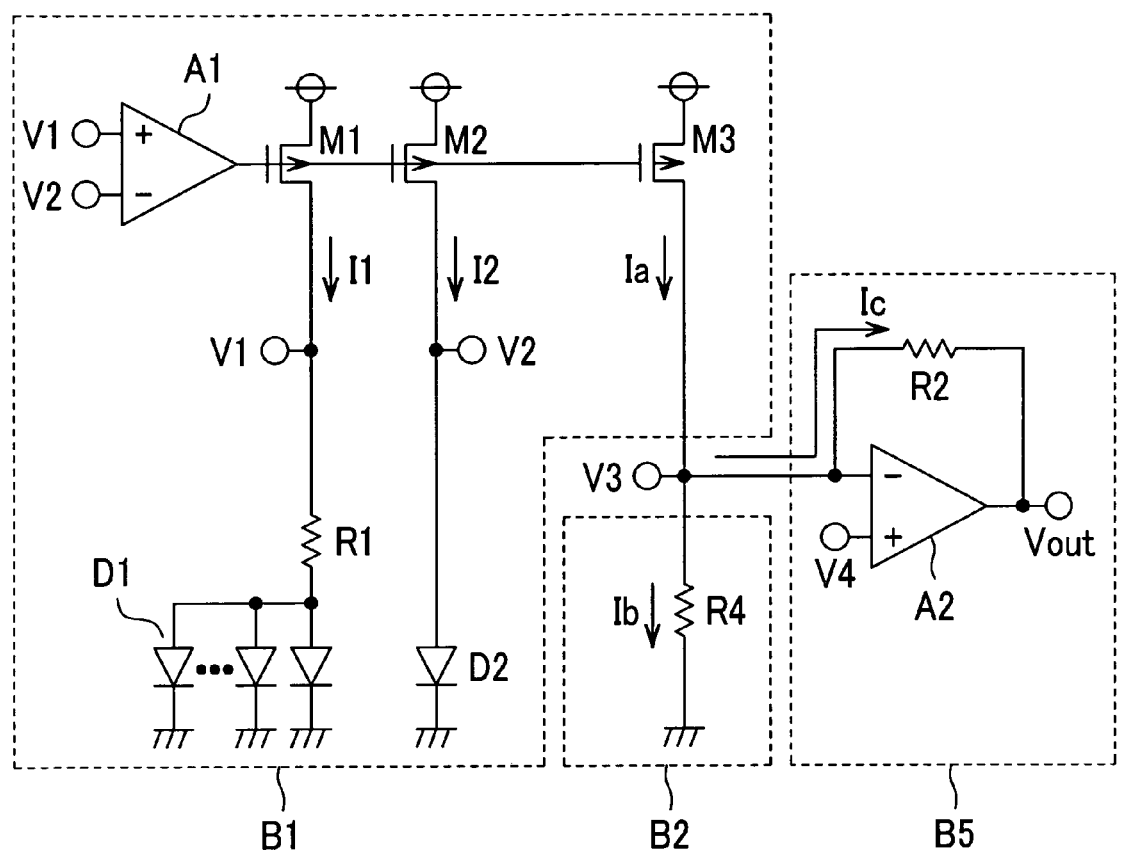
FIG. 8 is a circuit diagram showing another example of configuration of the current generator shown in FIG. 5.

FIG. 8 is a circuit block diagram showing another configuration example of a current generator B2 which constitutes the temperature-to-voltage converter of the semiconductor integrated circuit device shown in FIGS. 1 and 5 of the first embodiment.

The current generator B2 in a third embodiment is of a configuration in which a resistor R4 is connected between an output terminal and a grounding terminal of the temperature-to-current converter B1. The temperature-to-current converter B1 and current-to-voltage converter B5 employed in the present embodiment are the same as those shown in FIGS. 5 and 7.

As shown in FIG. 5, voltage V3 at the output terminal of the temperature-to-current converter B1 is equal to the voltage V4 that is input to the inversion input terminal (−) of the operational amplifier A2 constituting the current-to-voltage converter B5, by the feedback operation of the operational amplifier A2.

Since the input voltage V4 is constant, the voltage V4 is applied across the resistor R4. The current Ib that flows thereinto becomes the constant current represented by expression (7).

$$Ib=V4/R4 \qquad (7)$$

In this way, it becomes possible, by utilizing the feedback operation of the operational amplifier A2, to output a constant current, even if power supply voltage VDD changes, and to compose the current generator B2 only with the resistor R4. A chip area can therefore be diminished.

Fourth Embodiment

Figure 9:
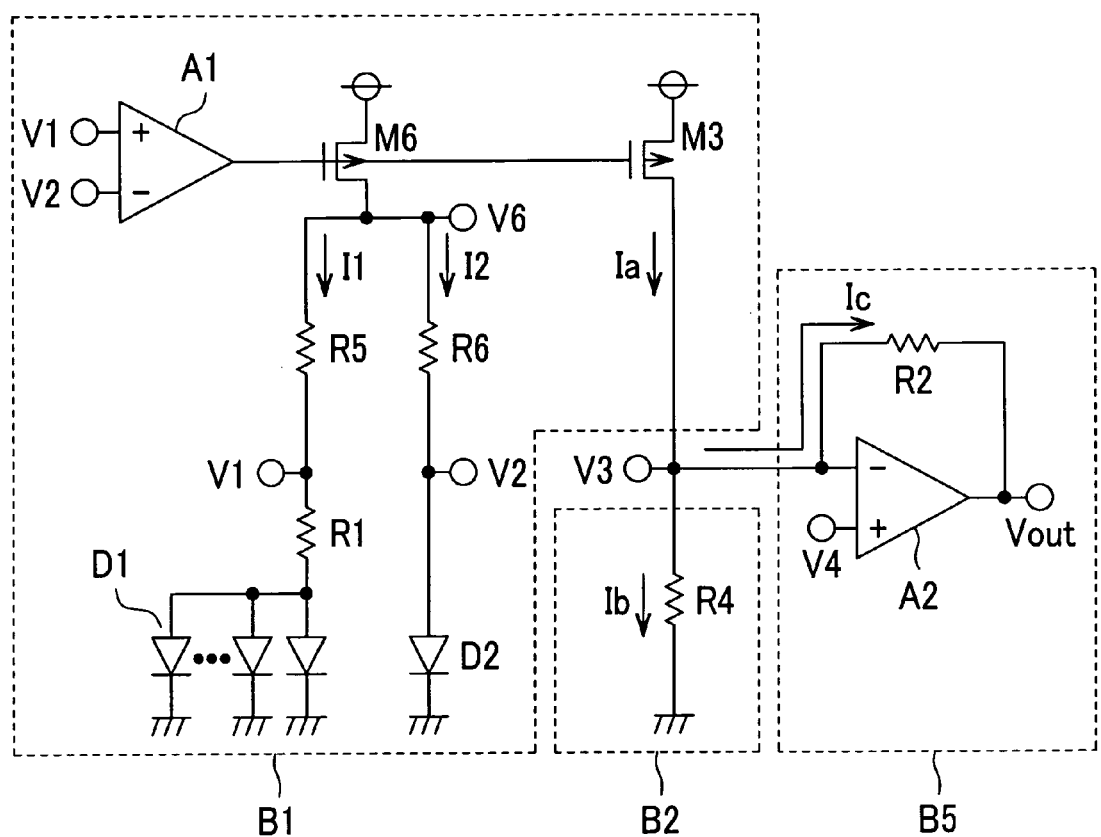
FIG. 9 is a circuit diagram showing another example of configuration of the temperature-to-current converter shown in FIG. 5.

FIG. 9 is a circuit block diagram showing another configuration example of a temperature-to-current converter B1 which constitutes the temperature-to-voltage converter of the semiconductor integrated circuit device shown in FIGS. 1 and 5 of the first embodiment.

In the temperature-to-current converter B1 of a fourth embodiment, in lieu of the MOS transistors M1 and M2 in FIG. 5, resistors R5 and R6 are connected between a drain terminal of a MOS transistor M6 having a gate terminal to which an output voltage of an operational amplifier A1 is applied, and a non-inversion input terminal (+) and an inversion input terminal (−) of the operational amplifier A1. Configuring the converter B1 in this fashion makes it possible to realize functions-equivalent to those of the MOS transistors M1 and M2 in the temperature-to-current converter B1 of FIG. 5. Also, voltage V6 with extremely small temperature dependence can be obtained at the drain terminal of the MOS transistor M6 by the above configuration.

For its simplification, the description below assumes that the MOS transistors M1 and M2 are equal to each other in terms of transistor size.

From expression (4), the voltage V6 developed at the drain terminal of the MOS transistor M6 is expressed as a sum of a forward voltage VF2 of a diode D2 and the voltage developed across the resistor R6. Hence, the voltage V6 is represented as follows:

$$V6=VF2+(R6/R1)\cdot VT\cdot lnN \qquad (8)$$

As shown in Patent Reference 3, the voltage V6 developed at the drain terminal of the MOS transistor M6 can be changed into a bandgap reference voltage of extremely small temperature dependence, by adjusting a value of R6.

Therefore, applying the output voltage V6 to the non-inversion input terminal (+) of the operational amplifier A2 constituting the current-to-voltage converter B5 makes output terminal voltage V3 of the temperature-to-current converter B1 equal to the output voltage V6, thus allowing the resistor R4 to operate as a current generator.

Another reference voltage generator for applying an output voltage to the non-inversion input terminal (+) of the operational amplifier A2 becomes unnecessary by adding a current generator function to the temperature-to-current converter B1 in the above way. As a result, a chip area can be reduced.

In addition, drain terminals of MOS transistors M3 and M6 become the same in potential. Current errors due to any effects of the drain conductance that the MOS transistors have are significantly diminished and this, in turn, diminishes any voltage errors in the output voltage Vout of the temperature-to-voltage converter.

Fifth Embodiment

Figure 10:
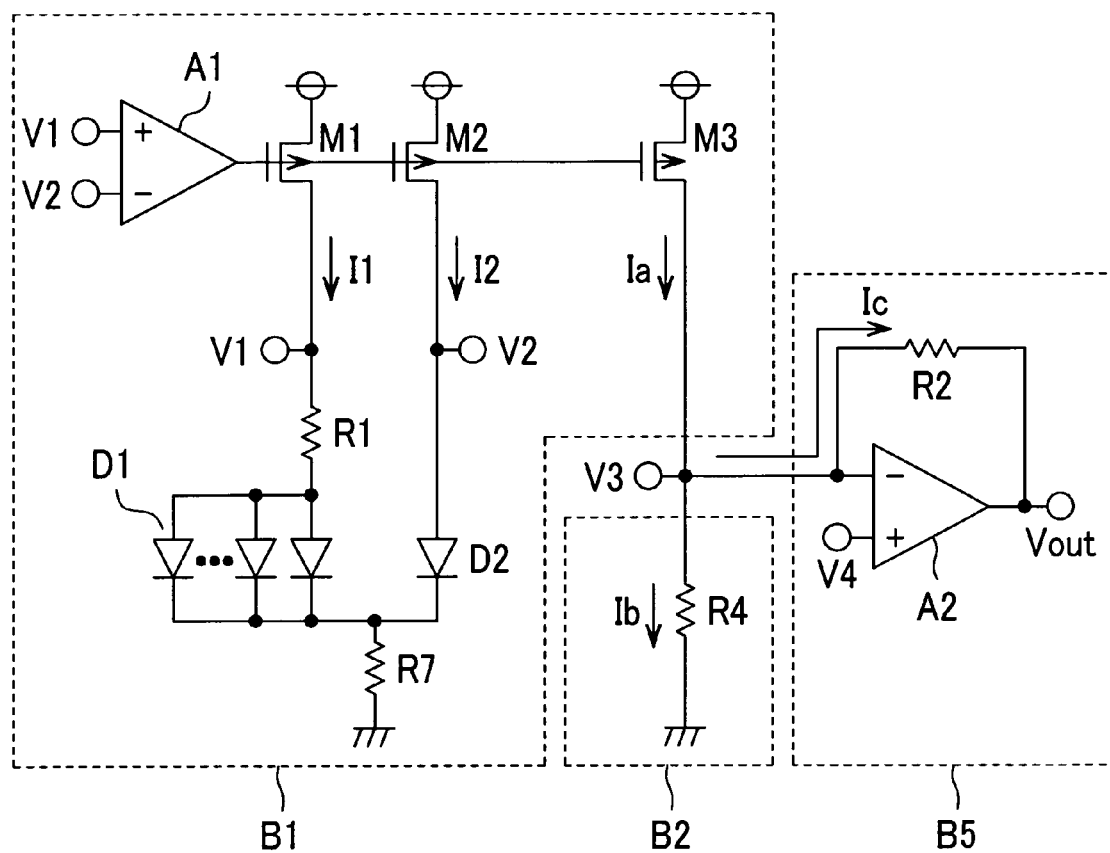
FIG. 10 is a circuit diagram showing yet another example of configuration of the temperature-to-current converter shown in FIG. 5.

FIG. 10 is a circuit block diagram showing yet another configuration example of a temperature-to-current converter B1 which constitutes the temperature-to-voltage converter of the semiconductor integrated circuit device shown in FIGS. 1 and 5 of the first embodiment.

The temperature-to-current converter B1 of a fifth embodiment is of a configuration in which a resistor R7 is inserted between respective cathode terminals of the diodes D1 and D2 constituting the temperature-to-current converter B1 shown in FIG. 5, and a grounding terminal.

The voltage V1 developed at a drain terminal of a MOS transistor M1, and the voltage V2 developed at a drain terminal of a MOS transistor M2 can be calculated as follows using an expression similar to expression (8):

$$V1=V2=VF1+(2\cdot R7/R1)\cdot VT\cdot lnN \qquad (9)$$

Output voltages V1 and V2, both with extremely small temperature dependence, can be obtained at the drain terminals of the MOS transistors M1 and M2 by assigning a value of the resistor R7 in the present embodiment, as with the embodiment shown in FIG. 9.

Output voltage V1 or V2 can therefore be used as a reference voltage of extremely small temperature dependence, and advantageous effects similar to or equivalent to those of the fourth embodiment can be obtained.

In addition, the current flowing through the resistor R7 will be twice the current I1 flowing into the MOS transistor M1, so the value of the resistor R7 can be limited to half a total resistance value of the resistors R5 and R6 shown in FIG. 9. A reduced chip area can be obtained.

Sixth Embodiment

Figure 11:
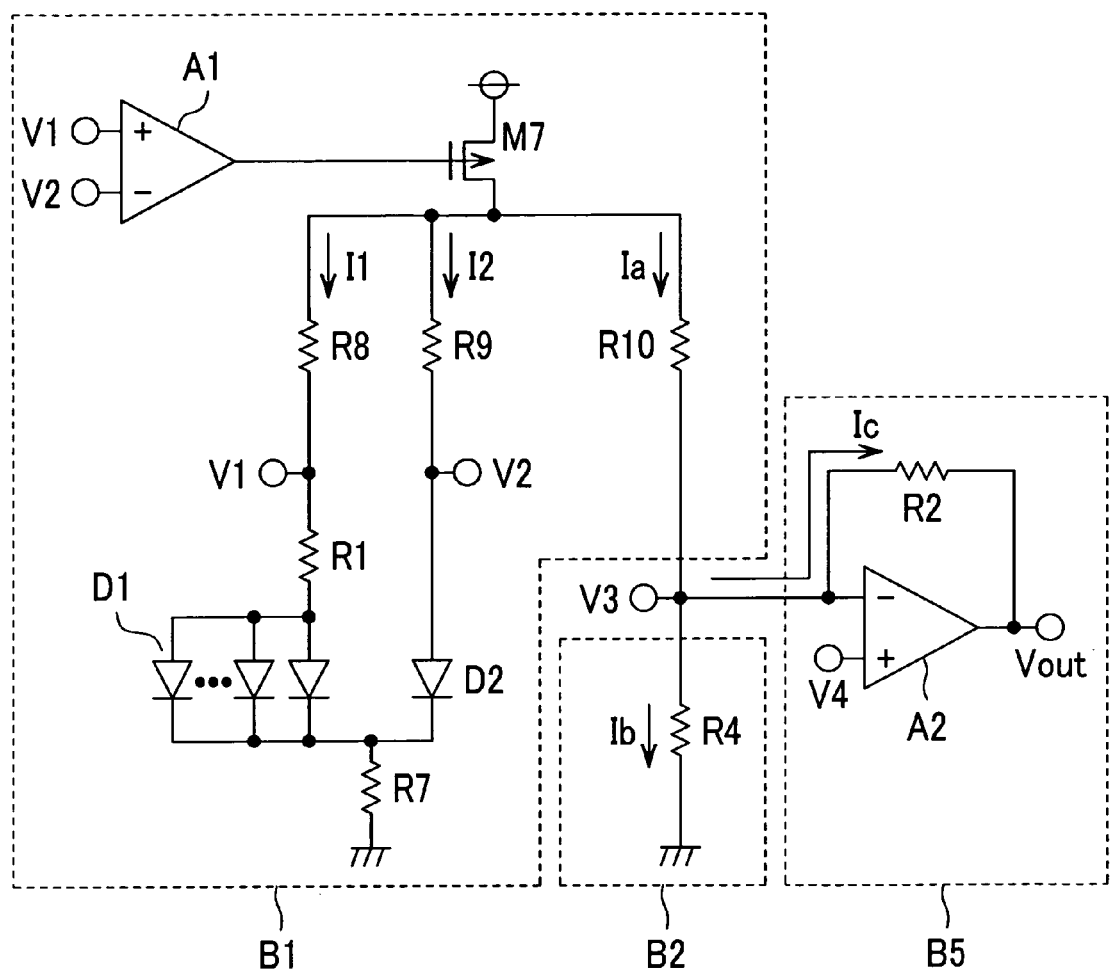
FIG. 11 is a circuit diagram showing a further example of configuration of the temperature-to-current converter shown in FIG. 5.

FIG. 11 is a circuit block diagram showing a further configuration example of a temperature-to-current converter B1 which constitutes the temperature-to-voltage converter of the semiconductor integrated circuit device shown in FIGS. 1 and 5 of the first embodiment.

In the temperature-to-current converter B1 of the present embodiment, in lieu of the MOS transistors M1 to M3 in FIG. 5, resistors R8, R9, and R10, respectively, are connected between a drain terminal of a MOS transistor M7 having a gate terminal to which an output voltage of an operational amplifier A1 is applied, a non-inversion input terminal (+) and inversion input terminal (−) of the operational amplifier A1, and an output terminal of the temperature-to-current converter B1. The converter B1 is composed in this fashion to realize functions equivalent to those of the MOS transistors M1 to M3 in the temperature-to-current converter B1 of FIG. 10.

In general, relative errors between the resistors arranged adjacently to one another in one chip are small in magnitude, compared with those of the MOS transistors arranged adjacently to one another in one chip. Accordingly, errors in the output current Ia of the temperature-to-current converter B1 can be reduced in magnitude by distributing the current via resistors, as in the present embodiment.

While a detailed description based on the embodiments has been given above of the invention made by the present inventors, the present invention is not limited to the above embodiments and it goes without saying that various changes may be made to the embodiments without departing from the scope thereof. For example, while PMOS transistors are used to configure the circuit in FIG. 5, equivalent circuits can likewise be configured by using NMOS transistors instead.

The power supply circuit, receiver, transmitter, controller, and memory in the contactless electronic device of FIG. 1 may likewise be composed by using a plurality of semiconductor integrated circuit devices. The present invention can be used widely for the semiconductor integrated circuit devices and contactless electronic devices having a temperature-measuring function.

The meanings of the symbols used in the drawings accompanying the present application are listed below.

A1-A3 . . . Operational amplifiers,
B1 . . . Temperature-to-current converter,
B2 . . . Current generator,
B3 . . . Current subtracter,
B4, B5 . . . Current-to-voltage converters,
C1 . . . Resonating capacitor,
D1, D2 . . . PN-junction diodes,
Ia, Ib, Ic, I1, I2, I3 . . . Currents,
L1 . . . Antenna,
LA, LB . . . Antenna connection terminals,
M1-M6 . . . MOS transistors,
R1-R10 . . . Resistors,
V1-V6 . . . Voltages at each connection,
VDD . . . Power supply voltage,
Vout . . . Output voltage,
U1 . . . Contactless electronic device,
U2 . . . Semiconductor integrated circuit device,
U3 . . . Power supply circuit,
U4 . . . Internal circuit,
U5 . . . Receiver,
U6 . . . Transmitter,
U7 . . . Controller,
U8 . . . Memory,
U9 . . . A/D converter,
U10 . . . Temperature-to-voltage converter,
U11 . . . Printed-circuit board,
U12 . . . Coil,
U13 . . . IC chip,
U14 . . . Interrogator,
U15 . . . Semiconductor integrated circuit device,
U16 . . . Coil formed by the wiring layer on semiconductor integrated circuit device.

What is claimed is:

1. A semiconductor integrated circuit device, comprising:
a temperature-to-current converter which outputs a first electric current according to a particular change in temperature;
a current generator which outputs a second electric current of small temperature dependence, compared with temperature dependence of the first electric current; and
a current-to-voltage converter which receives as an input a third electric current equivalent to a difference between the first electric current and the second electric current, converts the third electric current into a voltage, and outputs the voltage, wherein the temperature-to-current converter comprises:

a power supply line which gives a power supply potential;
a reference line which gives a grounding potential;
a first electric-current path including a first MOS transistor connected at one terminal thereof to the power supply line, a first resistor to which another terminal of the first MOS transistor is connected, and a plurality of parallel-interconnected PN-junction diodes each connected to the first resistor, wherein the first electric-current path is terminated at the reference line;
a second electric-current path including a second MOS transistor connected at one terminal thereof to the power supply line, and a PN-junction diode to which another terminal of the second MOS transistor is connected, wherein the second electric-current path is terminated at the reference line;
a third electric-current path having a third MOS transistor connected between the power supply line and an output terminal of the temperature-to-current converter; and
a first operational amplifier whose non-inversion input terminal is connected to another terminal of the first MOS transistor, whose inversion input terminal is connected to another terminal of the second MOS transistor, and whose output terminal is connected to gate terminals of each of the first to third MOS transistors; and wherein, in the current generator:
a thirteenth resistor and a tenth MOS transistor are connected in series between the power supply line and the reference line; and
an eleventh MOS transistor is connected between the reference line and an output terminal of the temperature-to-current converter; and wherein
a sixth operational amplifier with a non-inversion input terminal to which a potential at a connection point between the thirteenth resistor and the tenth MOS transistor is input, and with an inversion input terminal to which a second reference potential is input, has an output terminal connected to gate terminals of the tenth and eleventh MOS transistors.

2. The semiconductor integrated circuit device according to claim 1, wherein the current generator includes:
a fourteenth resistor is connected between the reference line and an output terminal of a temperature-to-current converter.

3. A semiconductor integrated circuit device, comprising:
a temperature-to-current converter which outputs a first electric current according to a particular change in temperature;
a current generator which outputs a second electric current of small temperature dependence, compared with temperature dependence of the first electric current; and
a current-to-voltage converter which receives as an input a third electric current equivalent to a difference between the first electric current and the second electric current, converts the third electric current into a voltage, and outputs the voltage, wherein the temperature-to-current converter comprises:
a power supply line which gives a power supply potential;
a reference line which gives a grounding potential;
a fourth electric-current path including a fourth MOS transistor connected at one terminal thereof to the power supply line, a second resistor to which another terminal of the fourth MOS transistor is connected, a third resistor connected to the second resistor, and a plurality of parallel-interconnected PN-junction diodes each connected to the third resistor, wherein the fourth electric-current path is terminated at the reference line;

a fifth electric-current path including a fourth resistor connected to yet another terminal of the fourth MOS transistor, and a PN-junction diode connected to the fourth resistor;

a sixth electric-current path having a fifth MOS transistor connected between the power supply line and an output terminal of the temperature-to-current converter; and a second operational amplifier whose non-inversion input terminal is connected to a connection point between the second resistor and the third resistor, whose inversion input terminal is connected to a connection point between the fourth resistor and the PN-junction diode, and whose output terminal is connected to gate terminals of the fourth and fifth MOS transistors; and wherein the current-to-voltage converter includes:

a fifth operational amplifier with a non-inversion input terminal to which a first reference potential is input, and with an inversion input terminal to which an output terminal of the temperature-to-current converter is connected; and a twelfth resistor interposed so as to connect the output terminal of the temperature-to-current converter and an output terminal of the current-to-voltage converter; and wherein the current-to-voltage converter:

conducts control so that a potential developed at the output terminal of the current-to-voltage converter will be equal to the first reference potential; and outputs a voltage proportional to temperature, by generating the third electric current proportional to the difference between the first electric current output from the temperature-to-current converter, and the second electric current output from the current generator, and inducting the third electric current into the twelfth resistor.

4. The semiconductor integrated circuit device according to claim 3, wherein the temperature-to-current converter further comprises:

a seventh electric-current path including a sixth MOS transistor connected at one terminal thereof to the power supply line, a fifth resistor connected to another terminal of the sixth MOS transistor, and a plurality of parallel-interconnected PN-junction diodes each connected to the fifth resistor, wherein the seventh electric-current path is terminated at the reference line via a sixth resistor;

an eighth electric-current path including a seventh MOS transistor connected at one terminal thereof to the power supply line, and a PN-junction diode connected to another terminal of the seventh MOS transistor, wherein the eighth electric-current path is terminated at the reference line via the sixth resistor;

a ninth electric-current path having an eighth MOS transistor connected between the power supply line and an output terminal of the temperature-to-current converter; and a third operational amplifier whose non-inversion input terminal is connected to yet another terminal of the sixth MOS transistor, whose inversion input terminal is connected to yet another terminal of the seventh MOS transistor, and whose output terminal is connected to gate terminals of each of the sixth to eighth MOS transistors.

5. The semiconductor integrated circuit device according to claim 3, wherein:

a voltage developed at a drain terminal of the fourth MOS transistor is used as the first reference potential.

6. The semiconductor integrated circuit device according to claim 3, wherein:

either a voltage developed at a connection point between the second resistor and the third resistor, or a voltage developed at a connection point between the fourth resistor and a PN-junction diode connected thereto is used as the first reference potential.

7. A semiconductor integrated circuit device, comprising:

a temperature-to-current converter which outputs a first electric current according to a particular change in temperature;

a current generator which outputs a second electric current of small temperature dependence, compared with temperature dependence of the first electric current; and a current-to-voltage converter which receives as an input a third electric current equivalent to a difference between the first electric current and the second electric current, converts the third electric current into a voltage, and outputs the voltage, wherein the temperature-to-current converter comprises:

a power supply line which gives a power supply potential;

a reference line which gives a grounding potential;

a tenth electric-current path including a ninth MOS transistor connected at one terminal thereof to the power supply line, a seventh resistor to which another terminal of the ninth MOS transistor is connected, an eighth resistor connected to the seventh resistor, and a plurality of parallel-interconnected PN-junction diodes each connected to the eighth resistor, wherein the tenth electric-current path is terminated at the reference line via a ninth resistor;

a tenth electric-current path including a tenth resistor connected to yet another terminal of the ninth MOS transistor, and a PN-junction diode connected to the tenth resistor, wherein the tenth electric-current path is terminated with the reference line via the ninth resistor;

an eleventh electric-current path having an eleventh resistor connected between another terminal of the ninth MOS transistor and an output terminal of the temperature-to-current converter; and a fourth operational amplifier whose non-inversion input terminal is connected to a connection point between the seventh resistor and the eighth resistor, whose inversion input terminal is connected to a connection point between the tenth resistor and the PN-junction diode, and whose output terminal is connected to a gate terminal of the ninth MOS transistor; and wherein the current-to-voltage converter includes:

a fifth operational amplifier with a non-inversion input terminal to which a first reference potential is input, and with an inversion input terminal to which an output terminal of the temperature-to-current converter is connected; and a twelfth resistor interposed so as to connect the output terminal of the temperature-to-current converter and an output terminal of the current-to-voltage converter; and wherein the current-to-voltage converter:

conducts control such that a potential developed at the output terminal of the current-to-voltage converter will be equal to the first reference potential; and outputs a voltage proportional to temperature, by generating the third electric current proportional to the difference between the first electric current output from the temperature-to-current converter, and the second electric current output from the current generator, and inducting the third electric current into the twelfth resistor.

8. The semiconductor integrated circuit device according to claim 7, wherein:

either a voltage developed at a connection point between the seventh resistor and the eighth resistor, or a voltage developed at a connection point between the tenth resistor and a PN-junction diode connected thereto is used as the first reference potential.

* * * * *